US012803238B2

(12) United States Patent
Black et al.

(10) Patent No.: US 12,803,238 B2
(45) Date of Patent: Nov. 17, 2026

(54) LIGHT SOURCE SYSTEM AND METHOD OF OPERATION

(71) Applicant: xLight Inc., Palo Alto, CA (US)

(72) Inventors: Dylan Black, Palo Alto, CA (US); David Douglas, Palo Alto, CA (US); George Randall Neil, Palo Alto, CA (US); Bruce Dunham, Palo Alto, CA (US); Robert Legg, Palo Alto, CA (US); Christopher Mayes, Palo Alto, CA (US)

(73) Assignee: xLight Inc., Palo Alto, CA (US)

( * ) Notice: Subject to any disclaimer, the term of this patent is extended or adjusted under 35 U.S.C. 154(b) by 0 days.

(21) Appl. No.: 19/320,258

(22) Filed: Sep. 5, 2025

(65) Prior Publication Data

US 2026/0066607 A1 Mar. 5, 2026

Related U.S. Application Data

(60) Provisional application No. 63/690,954, filed on Sep. 5, 2024.

(51) Int. Cl.
*H01S 3/09* (2006.01)
*H01J 1/34* (2006.01)
*H01J 37/073* (2006.01)
*H05H 7/04* (2006.01)

(52) U.S. Cl.
CPC .............. *H01S 3/0903* (2013.01); *H01J 1/34* (2013.01); *H01J 37/073* (2013.01); *H05H 7/04* (2013.01)

(58) Field of Classification Search
CPC .. H01J 1/34; H01J 3/021; H01J 29/481; H01J 40/06; H01S 3/0903; H05H 7/04
See application file for complete search history.

(56) References Cited

U.S. PATENT DOCUMENTS

| | | | | |
|---|---|---|---|---|
| 4,703,228 | A * | 10/1987 | West | H01J 23/04 372/74 |
| 4,809,281 | A * | 2/1989 | Neil | H01S 3/0903 372/74 |
| 6,831,933 | B2 * | 12/2004 | Biedron | H01S 3/0959 372/74 |
| 9,728,931 | B2 * | 8/2017 | Nikipelov | H05H 7/08 |
| 9,823,572 | B2 | 11/2017 | Nikipelov et al. | |
| 10,437,154 | B2 | 10/2019 | Nikipelov et al. | |
| 10,468,225 | B2 * | 11/2019 | Nikipelov | H01J 37/073 |
| 10,627,724 | B2 | 4/2020 | Everts et al. | |

(Continued)

OTHER PUBLICATIONS

Hara, Toru, et al. "Pulse-by-pulse multi-beam-line operation for x-ray free-electron lasers." Physical Review Accelerators and Beams 19.2 (2016): 020703 (Year: 2016).*

(Continued)

*Primary Examiner* — Wyatt A Stoffa
(74) *Attorney, Agent, or Firm* — Jeffrey Schox; Samuel Rosenthal

(57) ABSTRACT

A photocathode system, preferably including one or more modulated light sources, sets of optics, and/or cathodes. One or more such photocathode systems, optionally integrated with a light source system. A method of operation for one or more photocathode systems and/or light source systems, preferably including controlling photocathode timing, and optionally including controlling one or more optical outputs.

20 Claims, 5 Drawing Sheets

(56) References Cited

U.S. PATENT DOCUMENTS

| | | | | |
|---|---|---|---|---|
| 10,884,339 | B2 * | 1/2021 | Engelen | G01J 1/0407 |
| 12,328,806 | B2 * | 6/2025 | Douglas | H01S 3/0903 |
| 2003/0026300 | A1 * | 2/2003 | Biedron | H01S 3/0959 372/2 |
| 2015/0129772 | A1 * | 5/2015 | Candler | H05H 9/005 250/396 ML |
| 2015/0285749 | A1 * | 10/2015 | Moncton | G01N 23/207 378/86 |
| 2016/0301180 | A1 * | 10/2016 | Nikipelov | H01S 3/0903 |
| 2017/0019982 | A1 * | 1/2017 | Hosler | H05G 2/00 |
| 2017/0264071 | A1 * | 9/2017 | Nikipelov | H01J 1/34 |
| 2020/0295522 | A1 | 9/2020 | Whitney et al. | |
| 2023/0226378 | A1 | 7/2023 | Bourhis et al. | |
| 2025/0055246 | A1 * | 2/2025 | Douglas | H01S 3/0903 |
| 2025/0056704 | A1 | 2/2025 | Douglas et al. | |

OTHER PUBLICATIONS

Yan, B. Y. “Design of the Beam Distribution System of Shine.” 2023 (Year: 2023).*

Paraliev, Martin, and Christopher Gough. “Development of high stability resonant kicker for Swiss Free Electron Laser.” 2013 19th IEEE Pulsed Power Conference (PPC). IEEE, 2013. (Year: 2013).*

* cited by examiner

LIGHT SOURCE SYSTEM AND METHOD OF OPERATION

CROSS-REFERENCE TO RELATED APPLICATIONS

This application claims the benefit of U.S. Provisional Application Ser. No. 63/690,954, filed on 5 Sep. 2024, which is incorporated in its entirety by this reference.

TECHNICAL FIELD

This invention relates generally to the light source field, and more specifically to a new and useful light source system and method of operation.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview

Figure 1:
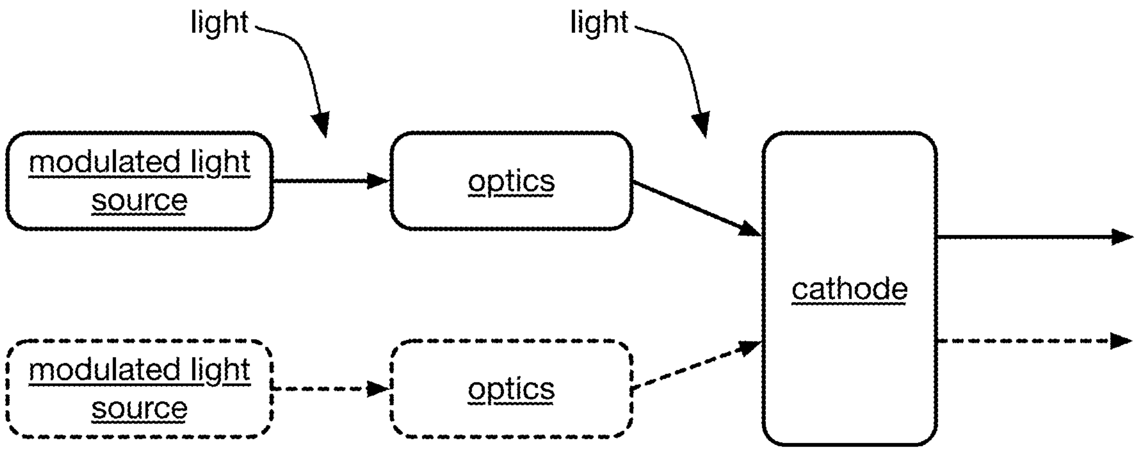
FIG. 1 is a schematic representation of an embodiment of a photocathode system.
Figure 2A:
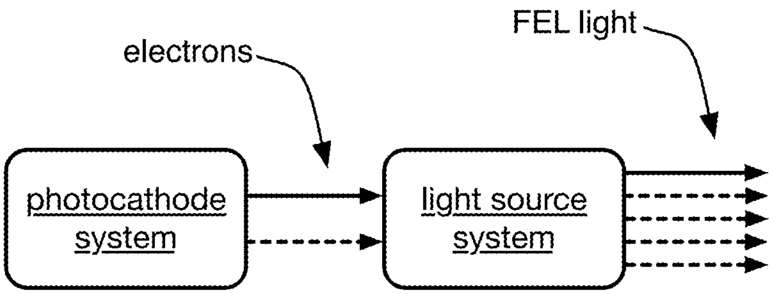
FIG. 2A-2B are schematic representations of a first and second embodiment, respectively, of integration of one or more photocathode systems with one or more light source systems.
Figure 2B:
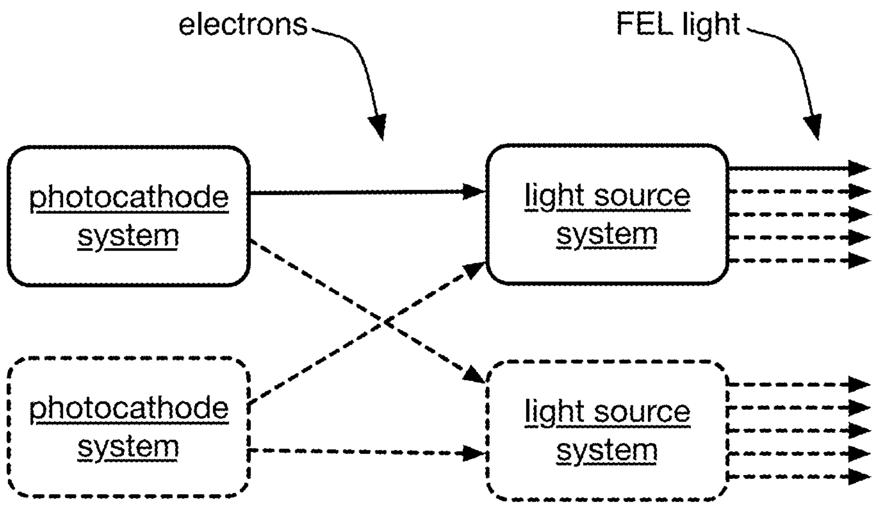

A photocathode system preferably includes one or more modulated light sources, sets of optics, and/or cathodes (e.g., as shown in FIG. 1). One or more photocathode systems can be integrated with a light source system (e.g., operable to produce one or more light outputs, preferably to produce multiple spatially separated light outputs), such as shown by way of examples in FIGS. 2A and/or 2B. However, the photocathode system can additionally or alternatively include any other suitable elements, and/or be integrated with any other suitable systems.

Figure 3:
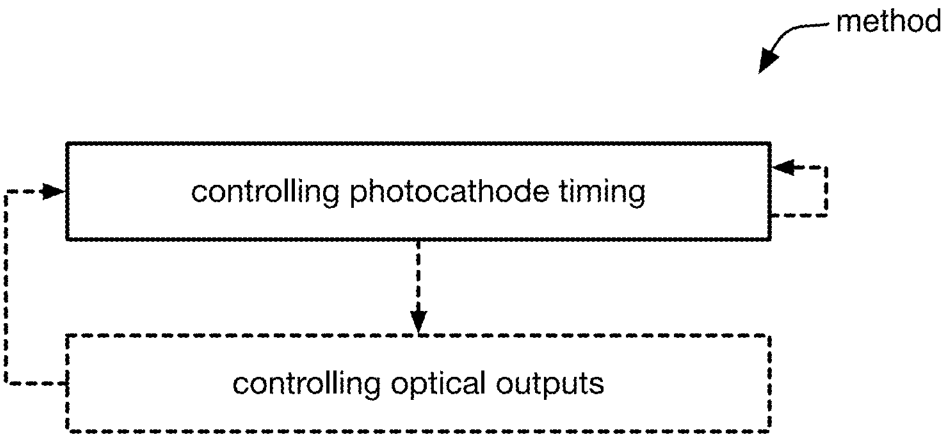
FIG. 3 is a schematic representation of an embodiment of a method of operation.

A method of operation (e.g., of one or more photocathode systems and/or light source systems) preferably includes controlling photocathode timing, and can optionally include controlling one or more optical outputs (e.g., as shown in FIG. 3). However, the method can additionally or alternatively include any other suitable elements performed in any suitable manner.

The photocathode system is preferably operable to perform the method of operation (e.g., in combination with a light source system and/or one or more other photocathode systems). The method of operation is preferably performed using one or more photocathode systems (e.g., in combination with a light source system). However, the system can additionally or alternatively be operable to perform any other suitable methods, and/or the method can optionally be performed using any other suitable systems.

In some embodiments, the light source system (and/or any elements thereof, including, without limitation, one or more radiator modules and/or accelerator modules), photocathode system (and/or any elements thereof, including, without limitation, one or more modulated light sources, sets of optics, and/or cathodes), and/or method of operation can include one or more elements (and/or any suitable aspects thereof) such as described in U.S. Patent Application Ser. No. 18/794,414, filed 5 Aug. 2024 and titled "LIGHT SOURCE SYSTEM AND METHOD OF OPERATION", U.S. Patent Application Ser. No. 14/803,068, filed 18 Jul. 2015 and titled "METHOD, APPARATUS AND SYSTEM FOR PROVIDING MULTIPLE EUV BEAMS FOR SEMICONDUCTOR PROCESSING", U.S. Pat. No. 9,541,839, granted 10 Jan. 2017 and titled "METHOD AND DEVICE FOR SPLITTING A HIGH-POWER LIGHT BEAM TO PROVIDE SIMULTANEOUS SUB-BEAMS TO PHOTOLITHOGRAPHY SCANNERS", U.S. Pat. No. 9,392,679, granted 12 Jul. 2016 and titled "METHOD, APPARATUS AND SYSTEM FOR USING FREE-ELECTRON LASER COMPATIBLE EUV BEAM FOR SEMICONDUCTOR WAFER PROCESSING", and/or U.S. Pat. No. 9,844,124, granted 12 Dec. 2017 and titled "METHOD, APPARATUS AND SYSTEM FOR USING FREE-ELECTRON LASER COMPATIBLE EUV BEAM FOR SEMICONDUCTOR WAFER METROLOGY", each of which is herein incorporated in its entirety by this reference. A person of skill in the art will recognize that, throughout this description, the terms "optical output" and "light output" are both used interchangeably to describe electromagnetic radiation output by the light source system.

2. Photocathode System 2.1 Modulated Light Source.

Figure 4A:
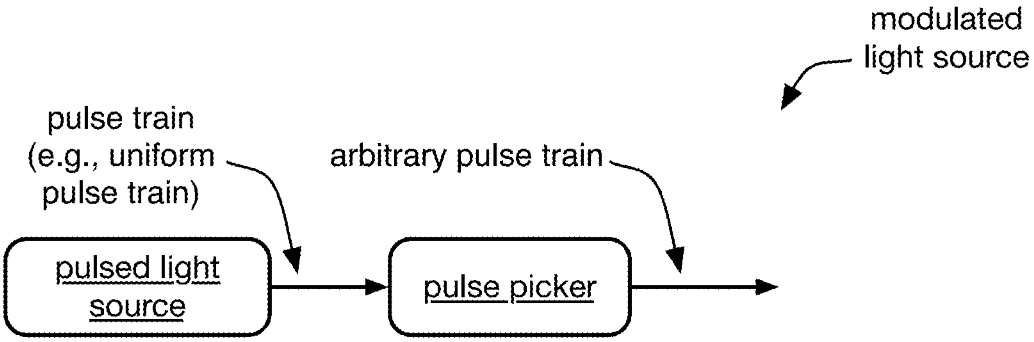
FIG. 4A is a schematic representation of an embodiment of a modulated light source of the photocathode system.

The modulated light source preferably functions to output an arbitrary sequence of light pulses. The modulated light source preferably includes a pulsed light source and a pulse picker (e.g., as shown in FIG. 4A). However, the modulated light source can additionally or alternatively include any other suitable elements in any suitable arrangement.

The pulsed light source preferably functions to provide a pulse train for modulation. The pulsed light source preferably outputs a uniform (or substantial uniform) pulse train (e.g., having a gigahertz scale repetition rate, such as 100 MHz to 10 GHz). However, the pulsed light source can optionally be controllable, such as operable to provide a pulse train of configurable repetition rate, and/or to provide an arbitrary (rather than uniform) pulse train. In one example, the pulsed light source is a pulsed laser (e.g., having a repetition rate of approximately 1 GHz), such as a pulsed seed laser.

The pulse picker preferably functions to modulate the pulse train by selectively passing pulses of the pulse train. The pulse picker preferably receives the pulse train from the pulsed light source and outputs the modulated pulse train (e.g., to a set of optics of the photocathode system). The pulse picker is preferably operable to arbitrarily (or substantially arbitrarily) modulate the pulse train, such as wherein it can be operable to pass or not pass any pulses of the pulse train (e.g., within a threshold range of duty cycle for the modulated pulse train, such as 1-100%). In examples, the pulse picker can include an electro-optic modulator (EOM), an acousto-optic modulator (AOM), a mechanical shutter, and/or any other suitable elements.

Each pulse output by the modulated light source is preferably substantially identical to every other pulse output by the modulated light source (e.g., within a threshold window, such as 1 s, 10 s, 100 s, 1000 s, 10,000 s, less than 1 s, 1-10 s, 10-100 s, 100-1000 s, 1000-10,000 s, more than 10,000 s, etc.; while one or more elements, such as the modulated light source and/or the light source system, are operating in a nominal mode; etc.), which can function to ensure that the resulting electron bunches generated by the light pulses are substantially identical to each other. For example, the pulses of the pulse train generated by the pulsed light source are preferably substantially identical, and the pulse picker preferably either does not substantially alter the pulses that it passes or alters all pulses that it passes in a substantially identical manner (e.g., regardless of which other pulses in the pulse train are passed or not passed, wherein the pulse picker exhibits substantially flat frequency response). However, the light pulses can alternatively differ from each other.

Figure 4B:
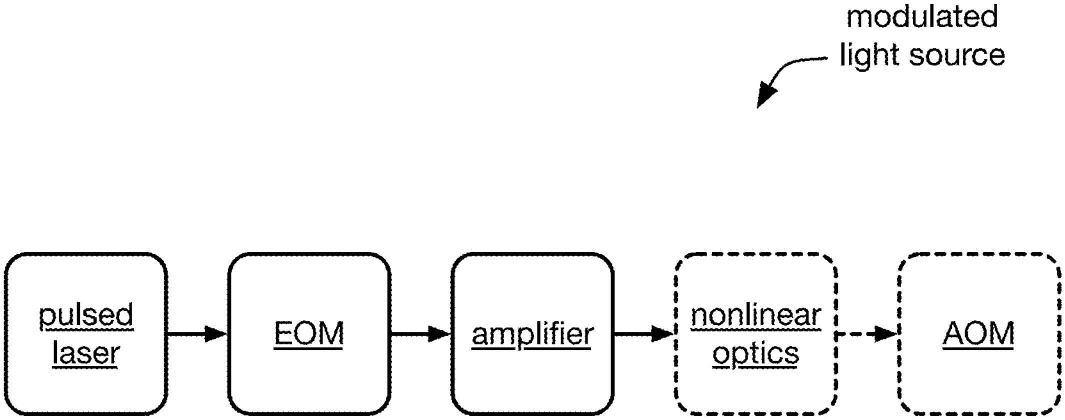
FIG. 4B is a schematic representation of an example of the modulated light source.

In one example, the modulated light source includes a pulsed laser (e.g., having a repetition rate of approximately 1 GHz, such as 1300 MHz; having a free space wavelength of 1030 nm, and/or any other suitable wavelength), an EOM, and/or an amplifier (e.g., as shown in FIG. 4B). Further, in this example, the photocathode system can optionally include nonlinear optics and/or an AOM. The pulsed laser preferably functions as the pulsed light source, providing a pulse train to the EOM, which preferably functions as a pulse picker, more preferably enabling fast arbitrary pulse picking. For example, the EOM can modulate the uniform pulse train received from the pulsed laser to generate an arbitrary pulse train (e.g., an arbitrary periodic sequence with a period of up to a threshold maximum, such as up to approximately 100 pulses; an arbitrary sequence with at least a threshold minimum number of transmitted pulses, such as wherein at least approximately 1% of the pulses of the uniform pulse train generated by the pulsed laser are transmitted; etc.). The EOM preferably provides the modulated pulse train to the amplifier, which preferably functions to amplify these pulses. The amplifier can then optionally provide the amplified pulses to a nonlinear optical element, which can function to generate a desired optical wavelength. For example, the modulated light source can include a second harmonic generator to produce light appropriate for exciting photocathode emission (e.g., green light, such as light having a wavelength of approximately 515 nm). Further, the light can optionally be provided (e.g., from the amplifier, the nonlinear optics, etc.) to an AOM, which can function to enable light modulation with high extinction. For example, the AOM can function to extinguish light transmission for more than 100 pulses in a row, preferably with a high extinction ratio.

In some examples, the photocathode system may include more than one modulated light source (e.g., wherein each modulated light source provides a light output to the same cathode and/or to multiple different cathodes, such as via the same set of optics and/or via different sets of optics).

However, the modulated light source can additionally or alternatively include any other suitable elements in any suitable arrangement.

2.2 Optics.

Figure 5A:
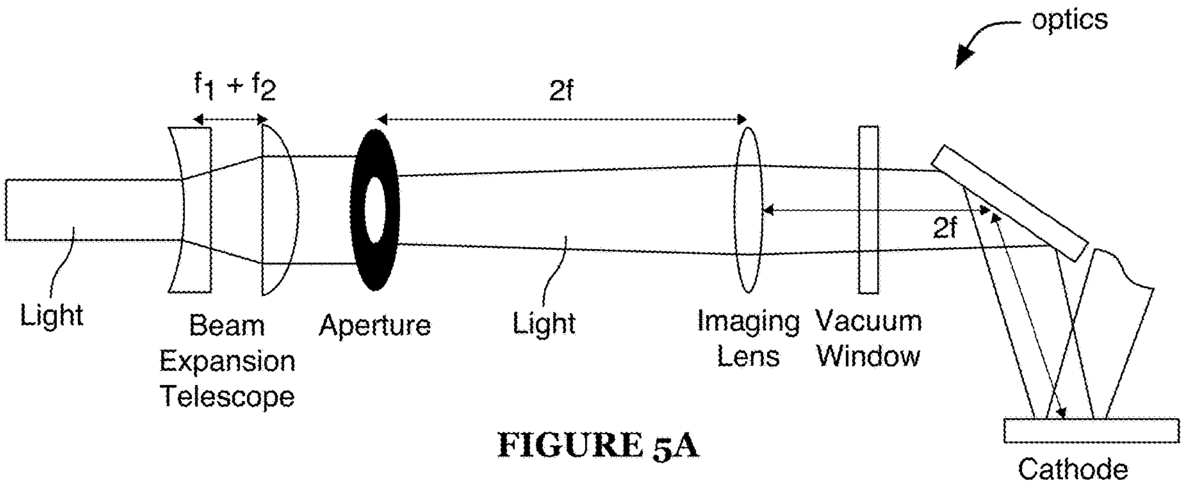
FIG. 5A-5B are schematic representations of a first and second example, respectively, of a set of optics of the photocathode system.
Figure 5B:
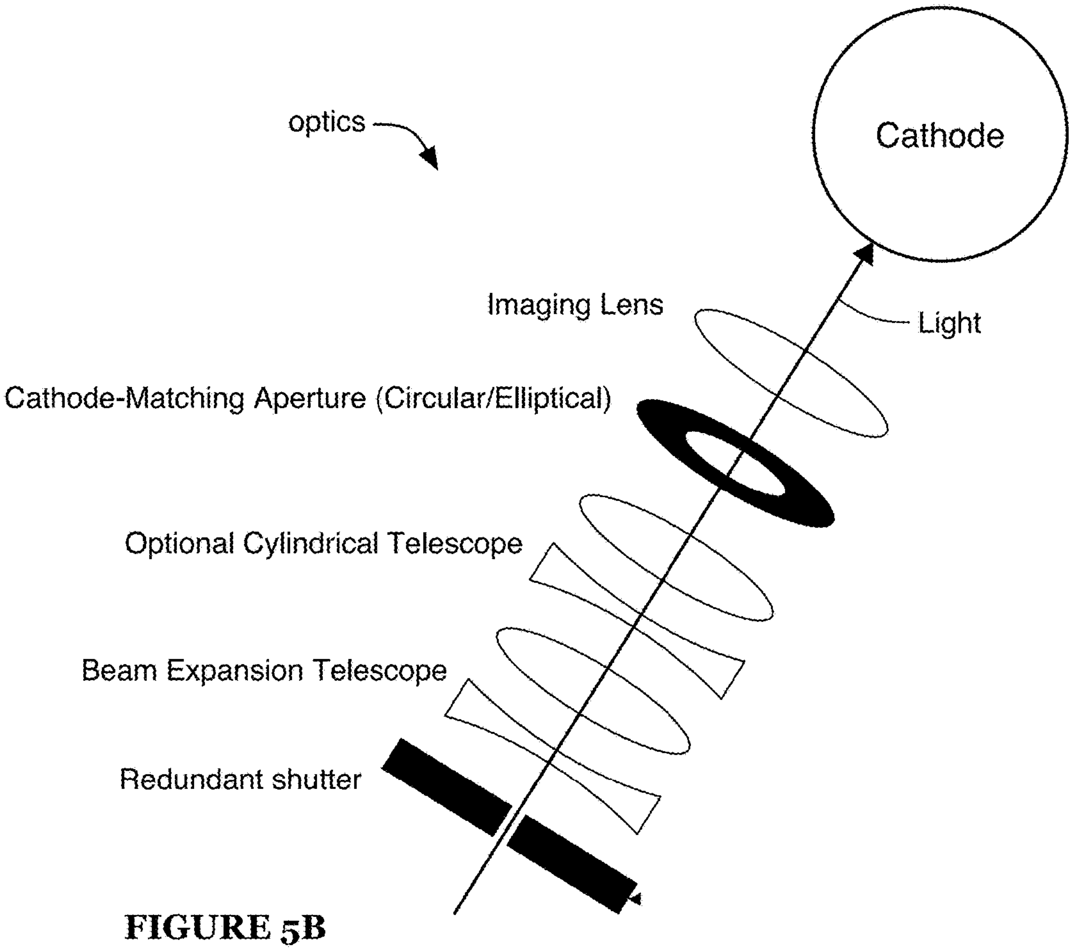

The optics preferably functions to direct and focus light onto the cathode. Each set of optics preferably receives light (e.g., modulated light, such as the arbitrary pulse train) from the modulated light source. The set of optics preferably includes one or more optical elements configured to direct the light toward the cathode, focus the light onto the cathode, select appropriate portions of light to transmit to the cathode (e.g., using an aperture to match the light to the cathode), and/or configure the light in any other suitable manner for delivery to the cathode. In one example, the set of optics can include a beam expansion telescope, a cathode-matching aperture (e.g., circular or elliptical aperture), and an imaging lens, and can optionally include a cylindrical telescope, a vacuum window, and/or one or more mirrors (e.g., as shown in FIGS. 5A and/or 5B).

In some examples, the photocathode system may include more than one set of optics (e.g., wherein each set of optics is configured to receive light from a different modulated light source, preferably functioning to deliver the light to one or more cathodes, such as wherein each set of optics delivers light to a different cathode, wherein all sets of optics deliver light to the same cathode, etc.).

In some embodiments, the optics can include fiber-based optical elements, free-space optical elements, and/or any other suitable optical elements. However, the optics can additionally or alternatively include any other suitable elements in any suitable arrangement.

2.3 Cathode.

The cathode preferably functions to generate electron bunches (e.g., with timing matching that of the modulated light source). The cathode preferably receives light (e.g., the modulated pulse train) from the set of optics. For each light pulse incident on the cathode, the cathode preferably emits a corresponding electron bunch (e.g., via photocathode emission). The electron bunches are preferably emitted into vacuum (e.g., for introduction to a downstream electron accelerator, such as an electron accelerator of a light source system with which the photocathode system is integrated).

In some examples, the photocathode system may include more than one cathode (e.g., each configured to receive light from a different modulated light source and/or via a different set of optics, all configured to receive light from the same modulated light source and/or via the same set of optics, etc.) However, the cathode can additionally or alternatively include any other suitable elements in any suitable arrangement.

Further, the photocathode system can additionally or alternatively include any other suitable elements in any suitable arrangement.

3. Light Source System

As described above, the photocathode system is preferably integrated with a light source system (e.g., wherein one or more photocathode systems are integrated with the light source system and operable to provide electron bunches to one or more electron accelerators of the light source system).

The light source system is preferably operable to produce one or more light outputs. The light is preferably output as multiple beams (e.g., spatially-separated light beams, preferably wherein each beam is collimated or substantially collimated), such as wherein different beams can be directed toward endpoints. The light output is preferably polarized or substantially polarized (e.g., to facilitate use with semiconductor fab photolithography equipment, such as steppers and/or scanners), but can alternatively be unpolarized, partially polarized, or have any other suitable polarization; in some embodiments, some or all light beams can have different polarizations as compared with each other (e.g., different linear polarizations, such as s-polarized and p-polarized light or other orthogonal polarizations, linear polarizations separated by an angle such as 5°, 10°, 15°, 30°, 45°, 60°, 75°, 105°, 120°, 135°, 150°, 165°, 0-10°, 10-30°, 30-60°, 60-90°, 90-120°, 120-150°, 150-180°, and/or any other suitable angle; different circular and/or elliptical polarizations, such as having opposing handedness and/or differing orientations of the major ellipse axis, such as wherein the major ellipse axis orientations are the same or differ in a manner analogous to that described above regarding different linear polarizations; some linearly polarized and others circularly and/or elliptically polarized, such as wherein the major ellipse axis orientation is the same as the linear polarization orientation or differs from the linear polarization orientation in a manner analogous to that described above regarding different linear polarizations; etc.). The light output is preferably coherent or substantially coherent, but can alternatively be incoherent or have any other suitable coherency. However, the light output by the light source system can additionally or alternatively have any other suitable characteristics. In some embodiments, the light source system can define a free-electron laser (FEL) or a plurality of FELs (e.g., wherein each FEL of the light source system is configured to output a separate beam of light), such as wherein the light preferably has spatial and/or temporal characteristics suitable and/or desirable for lithography applications, such as EUV lithography applications.

The light output preferably has high photon energy, such as being EUV light (e.g., 13.5 nm, 6.7 nm, 4.5 nm, 5-8 nm, 8-15 nm, greater than 15 nm, etc.), X-ray light, and/or any other suitable high-energy light, but can additionally or alternatively have any other suitable photon energy. In examples, the light output can be X-ray light (e.g., 3 nm, 1 nm, 0.1 nm, 0.01-0.1 nm, 0.1-0.2 nm, 0.2-0.5 nm, 0.5-1 nm, 1-2 nm, 2-5 nm, etc.), UV light, preferably EUV light (e.g., 13.5 nm, 6.7 nm, 4.5 nm, 5-8 nm, 8-15 nm, 15-30 nm, 30-121 nm, etc.) but additionally or alternatively any other suitable UV light (e.g., 100-280 nm, 280-315 nm, 315-400 nm, etc.), and/or any other suitable high-energy light, but can additionally or alternatively have any other suitable photon energy (e.g., visible light such as light having a wavelength in the 400-750 nm range, infrared light such as light having a wavelength in the 0.75-15 μm range and/or the 15-1000 μm range, millimeter-wave radiation such as light having a wavelength in the 1-10 mm range, etc.); a person of skill in the art will recognize that, although the wavelength of light may vary depending on the medium through which it propagates, the wavelengths described herein typically refer to the photon wavelength in a vacuum (the 'free-space photon wavelength'). The light output is preferably substantially monochromatic (e.g., having a bandwidth less than 1, 0.5, 0.3, 0.2, 0.1 nm, or less, less than 10%, 5%, 2%, 1%, or less of the nominal or central wavelength, etc.), but can alternatively have any other suitable bandwidth.

The light source system preferably includes multiple undulators in parallel, wherein some or all of the undulators are operable to generate one or more light outputs via free electron lasing (e.g., from the electron bunches delivered by the photocathode system). Further, the light source system preferably includes one or more splitters (and/or recombiners), such as kicker cavities (and/or sets of one or more kicker cavities, such as kicker cavities arranged in series and/or in parallel), which can function to direct electron bunches to the different undulators. For example, the light source system can include one or more elements such as described in U.S. patent application Ser. No. 18/374,911, filed 29 Sep. 2023 and titled "POLARIZATION-MULTIPLEXED RADIATOR SYSTEM, LIGHT SOURCE SYSTEM, AND METHOD OF OPERATION", and/or in U.S. patent application Ser. No. 18/794,414, filed 5 Aug. 2024 and titled "LIGHT SOURCE SYSTEM AND METHOD OF OPERATION", each of which is herein incorporated in its entirety by this reference.

Figure 6:
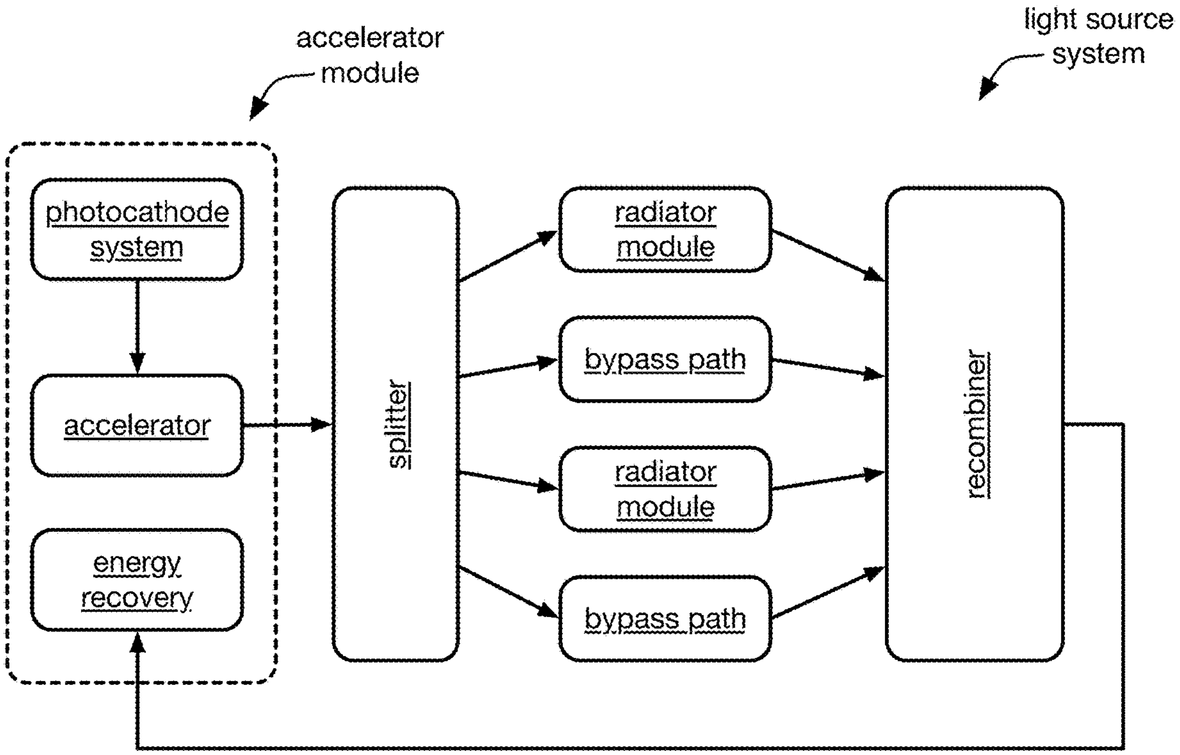
FIG. 6 is a schematic representation of an embodiment of a photocathode system integrated with a light source system.

The light source system can optionally include one or more bypass paths (e.g., wherein the one or more splitters can also be operable to direct electron bunches onto the bypass paths rather than to an undulator), such as shown by way of example in FIG. 6. In some examples, the bypass paths have substantially the same path length as the path through the undulator(s) being bypassed, but the bypass paths do not generate optical outputs via free electron lasing (or do not generate substantial optical outputs via free electron lasing). In examples, these bypass paths can enable fast blanking (and/or intensity reduction) of a light output without changing the average beam current in the accelerator system (e.g., as the same rate of electron bunches are generated and passed through the accelerator system, wherein some or all of the electron bunches are then shunted onto bypass paths rather than reducing the number of electron bunches generated and/or passed through the accelerator). Additionally or alternatively, light output from one or more undulators may be (e.g., temporarily) disabled by alteration of one or more steering, focusing, and/or undulation parameters of the undulator (e.g., wherein photocathode timing need not be altered to switch between a nominal configuration in which lasing is achieved for a particular electron bunch and a bypass configuration in which no lasing (alternatively, substantially no lasing, significantly diminished lasing, and/or any other suitable optical output characteristic) is achieved for the electron bunch (e.g., due to misfocusing within the undulator).

In some examples, the light source system can include multiple accelerator modules (e.g., as described in U.S. patent application Ser. No. 18/794,414, filed 5 Aug. 2024 and titled "LIGHT SOURCE SYSTEM AND METHOD OF OPERATION", which is herein incorporated in its entirety by this reference), preferably wherein each such accelerator module is integrated with one or more photocathode systems (e.g., wherein each such photocathode system is operable to deliver a train of electron bunches to the accelerator module with which it is integrated).

However, the light source system can additionally or alternatively include any other suitable elements in any suitable arrangement.

4. Method

The method of operation preferably includes controlling photocathode timing, and can optionally include controlling optical outputs. However, the method can additionally or alternatively include any other suitable elements performed in any suitable manner.

Figure 8:
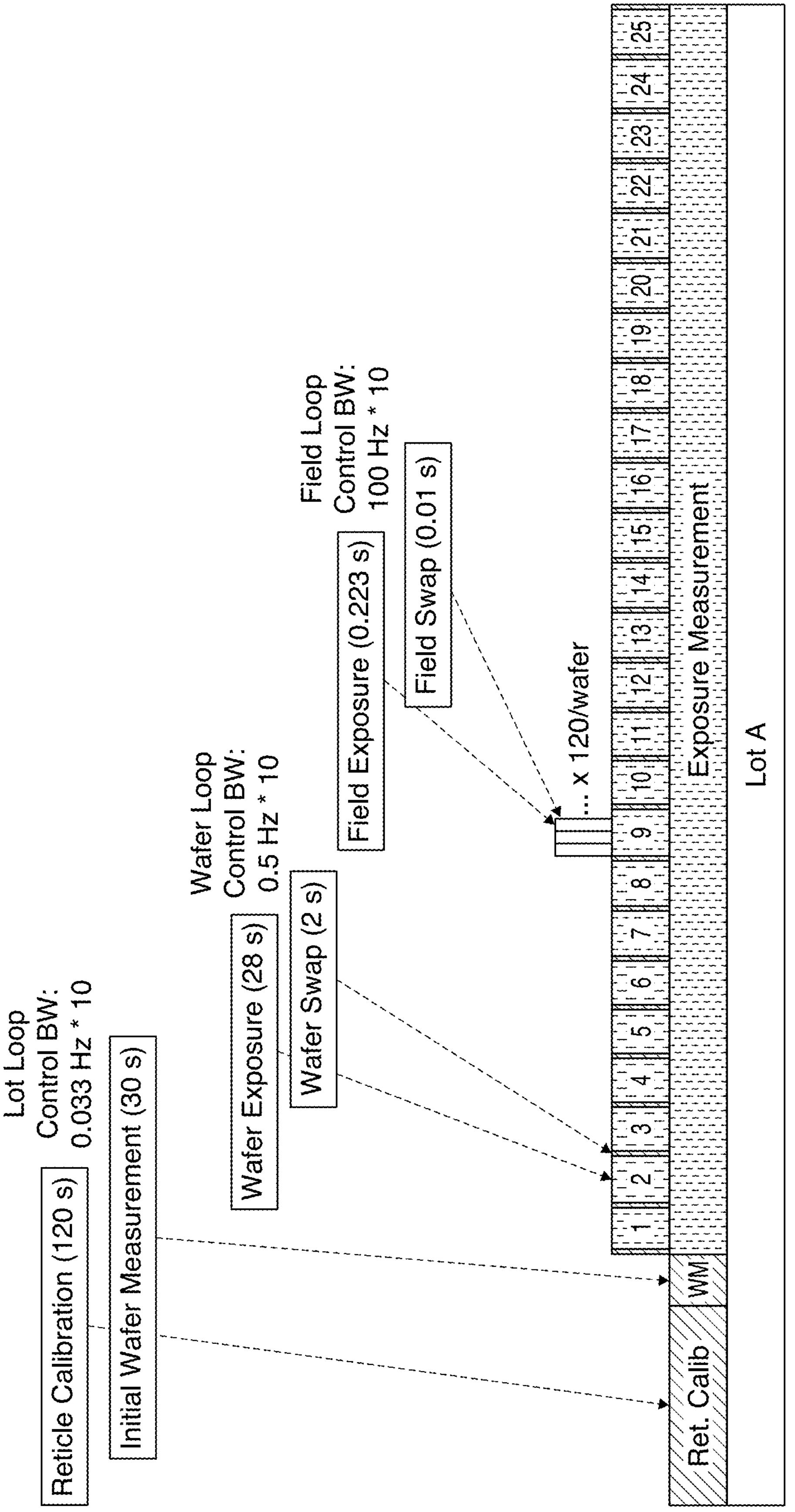
FIG. 8 is a schematic representation of a specific example of illumination timing for an endpoint.

Controlling photocathode timing preferably includes generating one or more pulse trains, and can optionally include generating one or more low-frequency pulse trains. The photocathode timing can be controlled based on desired light output conditions (e.g., based on light condition requests received from one or more endpoints, such as one or more photolithography scanners), based on accelerator requirements (e.g., meeting accelerator start-up requirements, maintaining a constant or slowly-changing average current within the accelerator, etc.), and/or based on any other suitable criteria. For example, controlling photocathode timing can be performed in response to receiving requests from one or more endpoints, accelerators, and/or any other suitable entities. In some examples, a single endpoint (e.g., scanner) may have illumination demands that include "dark" intervals (in which no illumination is desired) on the order of minutes (e.g., 50-250 seconds for reticle calibration, initial wafer measurement, and the like, such as occurring once every 5-60 minutes), seconds (e.g., 0.5-5 seconds for wafer swaps, such as occurring once every 10-60 seconds), milliseconds (e.g., 1-50 ms for field swaps, such as occurring once every 50-1000 ms), and/or with any other suitable timing; a specific example of desired light timing at a single scanner is depicted in FIG. 8.

Generating a pulse train (e.g., arbitrary or substantially arbitrary pulse train) preferably functions to determine electron bunch timing, thereby directing the generated electron bunches along different paths within a light source system (e.g., based on the timing of one or more kickers within the light source system). This can enable control of the optical output intensity from different radiator modules (e.g., thereby also enabling control of optical output locations, polarizations, and/or other characteristics, such as by directing electron bunches to the undulators configured to provide the desired optical output characteristics), the average beam current in different accelerators (e.g., enabling operation with constant, substantially constant, or slowly-varying average beam current despite changing light outputs, such as changing light output intensities, polarizations, and/or locations), and/or any other suitable characteristics associated with light source system operation.

For example, a light source system can include one or more splitters, each including one or more kickers (e.g., superconducting and/or non-superconducting kickers, such as RF kickers). Each kicker can be configured to generate a temporally-periodic (e.g., with RF periodicity) electromagnetic (EM) field within its cavity, such that electron bunches passing through the cavity will be redirected in different ways (e.g., directions and/or magnitudes) based on their timing relative to the temporal periodicity of the EM field within the cavity. Accordingly, the different electron bunches can be directed along different paths (e.g., to radiator modules and/or bypass paths) depending on their timing. The timing and/or other characteristics of this EM field are preferably substantially consistent during light source system operation (e.g., while generating optical outputs for delivery to one or more endpoints); accordingly, the paths along which electron bunches are directed is preferably controlled via (e.g., exclusively via) control of the electron bunch timing at the photocathode system (e.g., wherein the uniform pulse train represents all the possible electron bunch timings available, and the pulse picker functions to select which electron bunch timings will be active, and thus select the destinations of each electron bunch emitted by the photocathode system), but can additionally or alternatively be controlled by alteration of the kicker EM field timing (e.g., in cooperation with control of the electron bunch timing at the photocathode system). In one embodiment, the light source system includes one or more elements described in U.S. patent application Ser. No. 18/959,313, filed 25 Nov. 2024 and titled "LIGHT SOURCE SYSTEM AND METHOD OF OPERATION", which is herein incorporated in its entirety by this reference, such as wherein the light source system includes one or more splitters and/or recombiners such as described therein (e.g., wherein some possible electron beam trajectories resulting from such splitters and/or recombiners pass through undulators, such as described in U.S. patent application Ser. No. 18/959,313, whereas one or more other such trajectories do not pass through undulators and thus define one or more bypass paths). However, the light source system can additionally or alternatively include any other suitable elements in any suitable arrangement.

Generating the arbitrary pulse train is preferably performed at the EOM, but can additionally or alternatively be performed at any other suitable elements of the photocathode system. Generating an arbitrary pulse train can include determining a desired pulse train based on the desired destinations of the generated electron bunches (e.g., wherein the destination of each electron bunch is determined based on the timing of its incidence at one or more kickers of the light source system).

In a first embodiment, the method is performed at two photocathode systems integrated with a light source system (e.g., wherein both photocathode systems are operable to deliver electron bunches to a common light generation path, such as a path including one or more kickers). For example, this embodiment can be performed using a light source system such as described in U.S. patent application Ser. No. 18/794,414, filed 5 Aug. 2024 and titled "LIGHT SOURCE SYSTEM AND METHOD OF OPERATION", which is herein incorporated in its entirety by this reference. In this embodiment, operating in a nominal condition can include generating electron bunches in alternate order between the two photocathode systems (e.g., wherein each photocathode system pulse picks down to a 50% duty cycle, such as generating a one-on, one-off pulse train, preferably such that bunches from the two photocathodes do not coincide). In this embodiment, operating in a backup condition, such as in response to anomalous operation (e.g., failure) at and/or downstream of one photocathode system (e.g., at an accelerator module configured to receive electron bunches from that photocathode system) can include providing electron bunches only from the other photocathode system. For example, operating in the backup condition can include turning off the photocathode system associated with the anomalous operation and operating the other photocathode system (e.g., at a higher repetition rate than under the nominal condition, such as operating at twice the rate in the nominal condition without any pulse picking and/or at any other suitable repetition rate).

In a second embodiment, the method can be performed at a photocathode system integrated with a light source system operable to deliver electron bunches to one or more radiator modules and one or more bypass paths (e.g., wherein the timing of a kicker of the light source system is such that different bunches of an unmodulated pulse train from the photocathode system corresponding to the maximum repetition rate from the photocathode system would go to the different radiator modules and/or bypass paths). In this embodiment, operating under a first condition can include modulating the photocathode system output such that only electron bunches that will go through one of the radiator modules are emitted (wherein no electron bunches are delivered to bypass paths, as pulse picking is used to ensure that these electron bunches are not emitted). In this embodiment, operating in a second condition can include modulating the photocathode system output such that no electron bunches that would go through a particular one of the radiator modules are emitted (e.g., placing that radiator module in a "standby" mode in which it does not generate light via free-electron lasing). Preferably in this condition, the photocathode system instead emits electron bunches that will be delivered to one or more of the bypass paths (e.g., emitting an equal number of electron bunches as those that pass through the first radiator module when operating in the first condition).

Figure 7:
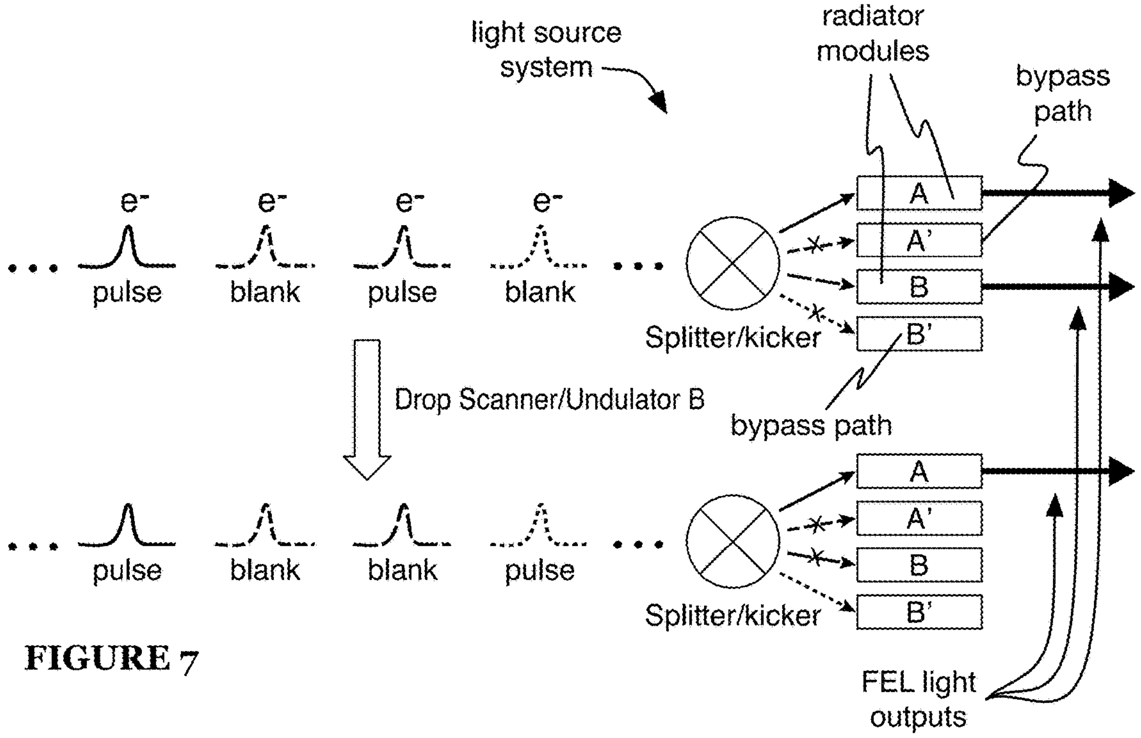
FIG. 7 is a schematic representation of an embodiment of controlling photocathode timing.

In a first example of this embodiment, the photocathode system delivers electron bunches to a kicker that exhibits a periodic field with a period equal to the interval in which four electron bunches are emitted from the photocathode system at its maximum repetition rate (with no pulse picking). Based on this periodicity, the first electron bunch would be directed to the first radiator module, the second electron bunch would be directed to the first bypass path, the third electron bunch would be directed to the second radiator module, the fourth electron bunch would be directed to the second bypass path, and then this pattern would repeat, with the fifth electron bunch being directed to the first radiator module, the sixth electron bunch being directed to the first bypass path, and so on. In this example, operating in the first condition can include modulating the pulse train to only include alternating pulses corresponding to odd-numbered electron bunches (the first bunch, third bunch, fifth bunch, and so on), wherein the generated electron bunches are directed to the first and second radiator modules (e.g., as shown in FIG. 7). In this example, operating in the second condition can include modulating the pulse train to generate a two-on, two-off sequence of pulses, thereby generating the first, fourth, fifth, and eighth electron bunches and so on, but not the second, third, sixth, and seventh bunches and so on. While operating in this condition, the corresponding generated electron bunches will be directed to the first radiator module and the second bypass path (e.g., as shown in FIG. 7).

In a second example of this embodiment, the photocathode system delivers electron bunches to one or more of a set of two kickers that are arranged in series (such that a first kicker of the set can direct electron bunches into the second kicker of the set), such as wherein the kickers are configured to deflect electron bunches within different planes (e.g., as described by way of example in U.S. patent application Ser. No. 18/959,313, filed 25 Nov. 2024 and titled "LIGHT SOURCE SYSTEM AND METHOD OF OPERATION", which is herein incorporated in its entirety by this reference). For example, the first kicker can be configured to deflect electron bunches within a first plane, and the second kicker can be configured to deflect electron bunches within a second plane that intersects the first plane (e.g., wherein the first plane is orthogonal or substantially orthogonal to the second plane).

In a first specific example of the second example, the first and second kickers can be configured such that they each exhibit a periodic field with a period equal to the interval in which eight electron bunches are emitted from the photocathode system at its maximum repetition rate (with no pulse picking). In this specific example, based on this periodicity, the first electron bunch would be directed by the first kicker to a first radiator module, the second electron bunch would be directed by the first kicker to a first bypass module, the third electron bunch would be directed by the first kicker to the second kicker and by the second kicker to a second radiator module, the fourth electron bunch would be directed by the first kicker to a second bypass module, the fifth electron bunch would be directed by the first kicker to a third radiator module, the sixth electron bunch would be directed by the first kicker to the second bypass module, the seventh electron bunch would be directed by the first kicker to the second kicker and by the second kicker to a fourth radiator module, the eighth electron bunch would be directed by the first kicker to the first bypass module, and then this pattern would repeat, with the ninth electron bunch being directed by the first kicker to the first radiator module, and so on. In this specific example, operating in the first condition can include modulating the pulse train to only include alternating pulses corresponding to even-numbered electron bunches (the second bunch, fourth bunch, sixth bunch, and so on), wherein the generated electron bunches are directed to the first, second, third, and fourth radiator modules. In this specific example, operating in the second condition can include modulating the pulse train as described above for operation in the first condition, except that the pulse train should exclude the pulse corresponding to the first bunch (and every eighth subsequent bunch) and instead include the pulse corresponding to the second bunch (and every eighth subsequent bunch) to exclude pulses corresponding to the first electron bunch and every fourth subsequent electron bunch (that is, omitting the first bunch, fourth bunch, sixth bunch, eighth bunch, ninth bunch, twelfth bunch, and so on), wherein the generated electron bunches are directed to the first bypass path and to the second, third, and fourth radiator modules, but not to the first radiator module.

In a second specific example of the second example, the first kicker can be configured such that it exhibits a periodic field with a period equal to the interval in which four electron bunches are emitted from the photocathode system at its maximum repetition rate (with no pulse picking), and the second kicker can be configured such that it exhibits a periodic field with a period equal to twice that of the first kicker. In this specific example, based on this periodicity, the first electron bunch would be directed by the first kicker to a first radiator module, the second electron bunch would be directed by the first kicker to the second kicker and by the second kicker to a second radiator module, the third electron bunch would be directed by the first kicker to a third radiator module, the fourth electron bunch would be directed by the first kicker to the second kicker and by the second kicker to a bypass path, the fifth electron bunch would be directed by the first kicker to the first radiator module, the sixth electron bunch would be directed by the first kicker to the second kicker and by the second kicker to a fourth radiator module, the seventh electron bunch would be directed by the first kicker to the third radiator module, the eighth electron bunch would be directed by the first kicker to the second kicker and by the second kicker to the bypass path, and then this pattern would repeat, with the ninth electron bunch being directed by the first kicker to the first radiator module, and so on. In this specific example, operating in the first condition can include modulating the pulse train to exclude pulses corresponding to the fourth electron bunch and every fourth subsequent electron bunch (that is, omitting the fourth bunch, eighth bunch, twelfth bunch, and so on), wherein the generated electron bunches are directed to the first, second, third, and fourth radiator modules. In this specific example, operating in the second condition can include modulating the pulse train to exclude pulses corresponding to the first electron bunch and every fourth subsequent electron bunch (that is, omitting the first bunch, fifth bunch, ninth bunch, and so on), wherein the generated electron bunches are directed to the bypass path and to the second, third, and fourth radiator modules, but not to the first radiator module.

In a third specific example of the second example, the first kicker can be configured such that it exhibits a periodic field with a period equal to the interval in which three electron bunches are emitted from the photocathode system at its maximum repetition rate (with no pulse picking), and the second kicker can be configured such that it exhibits a periodic field with a period equal to the interval in which two electron bunches are emitted from the photocathode system at its maximum repetition rate (with no pulse picking). In this specific example, based on this periodicity, the first electron bunch would be directed by the first kicker to a first radiator module, the second electron bunch would be directed by the first kicker a second radiator module, the third electron bunch would be directed by the first kicker to the second kicker and by the second kicker to a third radiator module, the fourth electron bunch would be directed by the first kicker to the first radiator module, the fifth electron bunch would be directed by the first kicker to the second radiator module, the sixth electron bunch would be directed by the first kicker to the second kicker and by the second kicker to the bypass path, and then this pattern would repeat, with the seventh electron bunch being directed by the first kicker to the first radiator module, and so on. In this specific example, operating in the first condition can include modulating the pulse train to only include alternating pulses corresponding to odd-numbered electron bunches (the first bunch, third bunch, fifth bunch, and so on), wherein the generated electron bunches are directed to the first, second, and third radiator modules. In this specific example, operating in the second condition can include modulating the pulse train to only include alternating pulses corresponding to even-numbered electron bunches (the second bunch, fourth bunch, sixth bunch, and so on), wherein the generated electron bunches are directed to the first and second radiator modules and to the bypass path. However, the method can additionally or alternatively include generating any other suitable pulse trains in any suitable manner.

Generating a low-frequency pulse train preferably functions to enable accelerator operation at a significantly reduced electron bunch repetition rate and/or average current (e.g., for use during an accelerator module and/or light source system startup process). Generating the low-frequency pulse train is preferably performed cooperatively at the EOM and AOM. For example, generating a low-frequency pulse train can include using the EOM to generate a pulse train in which most of the pulses are not transmitted (e.g., transmitting only one pulse out of every 100), then using the AOM to extinguish many of the remaining pulses transmitted by the EOM (e.g., along with much of the residual transmission of pulses that the EOM does not fully extinguish). However, the method can additionally or alternatively include generating one or more low-frequency pulse trains in any other suitable manner, and/or can include controlling photocathode timing in any other SUITABLE MANNER.

Controlling optical outputs can function to controllably transmit or discard the optical outputs after they are generated (e.g., with slower response time than enabled by modulation of the photocathode system output). For example, this can include controlling one or more optical shutters to block one or more of the optical outputs. However, the method can additionally or alternatively include controlling the optical outputs in any other suitable manner.

Further, the method of operation can additionally or alternatively include any other elements performed in any suitable manner.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method of light generation, comprising, during a time interval:

at an electron bunch splitter comprising a set of one or more kicker cavities, throughout the time interval, operating the set of kicker cavities according to a timing scheme, comprising, for each kicker cavity of the set, generating a respective temporally-periodic electromagnetic (EM) field within the kicker cavity;

generating a first plurality of spatially-separated electron bunches defining a bunch repetition rate, wherein generating the plurality of spatially-separated electron bunches comprises:

at a first photocathode system, generating a first sequence of electron bunches defining a first repetition rate less than the bunch repetition rate; and at a second photocathode system, generating a second sequence of electron bunches defining a second repetition rate less than the bunch repetition rate;

providing the plurality of spatially-separated electron bunches to the electron bunch splitter, wherein, based on the timing scheme, the electron bunch splitter:

directs a first subset of electron bunches of the first sequence toward a first undulator, the first subset defining a first undulator repetition rate; and directs a second subset of electron bunches of the second sequence toward a second undulator separate from the first undulator, the second subset defining a second undulator repetition rate;

after generating the first plurality of spatially-separated electron bunches, generating a second plurality of spatially-separated electron bunches defining a second bunch repetition rate substantially equal to the bunch repetition rate, wherein generating the second plurality of spatially-separated electron bunches comprises, at the first photocathode system, generating a third sequence of electron bunches defining a third repetition rate substantially equal to a sum of the first and second repetition rates;

after providing the plurality of spatially-separated electron bunches to the electron bunch splitter, providing the second plurality of spatially-separated electron bunches to the electron bunch splitter, wherein, based on the timing scheme, the electron bunch splitter:

directs a third subset of electron bunches of the second plurality of spatially-separated electron bunches toward the first undulator, the third subset defining a third subset repetition rate substantially equal to the first undulator repetition rate; and directs a fourth subset of electron bunches of the second plurality of spatially-separated electron bunches toward the second undulator, the fourth subset defining a fourth subset repetition rate substantially equal to the second undulator repetition rate;

at the first undulator:

receiving the first subset of electron bunches such that each electron bunch of the first subset traverses a first gap of the first undulator, thereby generating a respective optical output via free-electron lasing; and receiving the third subset of electron bunches such that each electron bunch of the third subset traverses the first gap, thereby generating a respective optical output via free-electron lasing; and at the second undulator:

receiving the second subset of electron bunches such that each electron bunch of the second subset traverses a second gap of the second undulator, thereby generating a respective optical output via free-electron lasing; and receiving the fourth subset of electron bunches such that each electron bunch of the fourth subset traverses the second gap, thereby generating a respective optical output via free-electron lasing;

wherein:

the first photocathode system comprises a modulated light source and a photocathode;

the modulated light source comprises a pulsed light source and a pulse picker;

the method further comprises, during the time interval, at the pulsed light source, generating a pulse train comprising a sequence of light pulses, the pulse train defining a seed repetition rate greater than or equal to the bunch repetition rate;

generating the first sequence of electron bunches comprises:

at the modulated light source, generating a first modulated sequence of light pulses defining a first light repetition rate substantially equal to the first repetition rate, wherein generating the first modulated sequence of light pulses comprises, at the pulse picker:

receiving a first contiguous segment of the pulse train;

transmitting a first subset of light pulses of the first contiguous segment, the first subset defining the first repetition rate; and not transmitting a second subset of light pulses of the first contiguous segment to the photocathode, wherein the first and second subsets partition the first contiguous segment; and at the photocathode, receiving the first modulated sequence of light pulses, wherein, for each light pulse of the first modulated sequence of light pulses: in response to receiving the light pulse, the photocathode generates a respective electron bunch of the first sequence of electron bunches.

2. The method of claim 1, wherein the third repetition rate is substantially equal to the second bunch rate.

3. The method of claim 1, wherein, while generating the second plurality of spatially-separated electron bunches, not operating the second photocathode system to generate electron bunches.

4. The method of claim 1, wherein the first repetition rate is substantially equal to the second repetition rate.

5. The method of claim 1, wherein generating the second sequence of electron bunches comprises:

at the modulated light source, generating a second modulated sequence of light pulses defining a second light repetition rate substantially equal to the second bunch repetition rate; and at the photocathode, receiving the second modulated sequence of light pulses, wherein, for each light pulse of the second modulated sequence of light pulses: in response to receiving the light pulse, the photocathode generates a respective electron bunch of the second plurality of spatially-separated electron bunches.

6. The method of claim 5, wherein generating the second modulated sequence of light pulses comprises, at the pulse picker:

receiving a second contiguous segment of the pulse train; and transmitting a third subset of light pulses of the second contiguous segment, the third subset defining the second bunch repetition rate.

7. The method of claim 6, wherein the second modulated sequence of light pulses consists essentially of the third subset of light pulses.

8. The method of claim 6, wherein generating the second modulated sequence of light pulses further comprises, at the pulse picker, not transmitting a fourth subset of light pulses of the second contiguous segment to the photocathode, wherein the third and fourth subsets partition the second contiguous segment.

9. The method of claim 6, wherein the pulsed light source generates the pulse train throughout the time interval, wherein the pulse train exhibits substantially uniform temporal spacing between each light pulse of the pulse train.

10. The method of claim 1, wherein the seed repetition rate is at least twice the bunch repetition rate.

11. A method of light generation, comprising:

at an electron bunch splitter comprising a set of one or more kicker cavities, throughout a time interval, operating the set of kicker cavities according to a timing scheme, comprising, for each kicker cavity of the set, generating a respective temporally-periodic electromagnetic (EM) field within the kicker cavity;

at a pulsed light source of a photocathode system, throughout the time interval, generating a pulse train comprising a sequence of light pulses, the pulse train defining a seed repetition rate;

at the photocathode system, during a first sub-interval of the time interval, generating a first plurality of spatially-separated electron bunches defining a bunch repetition rate less than the seed repetition rate, the first plurality defining a first substantially-periodic pattern, wherein generating the first plurality of spatially-separated electron bunches comprises:

at a pulse picker of the photocathode system:

receiving a first contiguous segment of the pulse train;

transmitting a first subset of light pulses of the first contiguous segment to a photocathode of the photocathode system, the first subset defining the bunch repetition rate; and not transmitting a second subset of light pulses of the first contiguous segment to the photocathode, wherein the first and second subsets partition the first contiguous segment;

at the photocathode:

receiving the first subset of light pulses; and in response to receiving the first subset of light pulses, generating the first plurality of spatially-separated electron bunches, comprising, for each light pulse of the first subset: in response to receiving the light pulse, generating a respective electron bunch of the first plurality of spatially-separated electron bunches;

during the first sub-interval, at the electron bunch splitter, receiving each electron bunch of the first plurality of spatially-separated electron bunches from the photocathode, wherein, based on the timing scheme, the electron bunch splitter:

directs a first subset of electron bunches of the first plurality onto a first trajectory into a first undulator, the first subset defining a first undulator repetition rate; and directs a second subset of electron bunches of the first plurality onto a second trajectory into a second undulator separate from the first undulator, the second subset defining a second undulator repetition rate;

at the photocathode system, during a second sub-interval of the time interval, wherein the second sub-interval does not overlap the first sub-interval, generating a second plurality of spatially-separated electron bunches defining a second bunch repetition rate substantially equal to the bunch repetition rate, the second plurality defining a second substantially-periodic pattern substantially different from the first substantially-periodic pattern, wherein generating the second plurality of spatially-separated electron bunches comprises:

at a pulse picker of the photocathode system:

receiving a second contiguous segment of the pulse train;

transmitting a third subset of light pulses of the second contiguous segment to the photocathode, the third subset defining the second bunch repetition rate; and not transmitting a fourth subset of light pulses of the second contiguous segment to the photocathode, wherein the third and fourth subsets partition the second contiguous segment;

at the photocathode:

receiving the third subset of light pulses; and in response to receiving the third subset of light pulses, generating the second plurality of spatially-separated electron bunches, comprising, for each light pulse of the third subset: in response to receiving the light pulse, generating a respective electron bunch of the second plurality of spatially-separated electron bunches;

during the second sub-interval, at the electron bunch splitter, receiving each electron bunch of the second plurality of spatially-separated electron bunches from the photocathode, wherein, based on the timing scheme, the electron bunch splitter:

directs a third subset of electron bunches of the second plurality onto the first trajectory, the third subset defining a third subset repetition rate substantially equal to the first undulator repetition rate; and directs a fourth subset of electron bunches of the second plurality onto a third trajectory, wherein the fourth subset of electron bunches are not directed into the first undulator and are not directed into the second undulator;

at the first undulator:

during the first sub-interval, receiving the first subset of electron bunches such that each electron bunch of the first subset traverses a first gap of the first undulator, thereby generating a respective optical output via free-electron lasing; and during the second sub-interval, receiving the third subset of electron bunches such that each electron bunch of the third subset traverses the first gap, thereby generating a respective optical output via free-electron lasing; and at the second undulator, during the first sub-interval, receiving the second subset of electron bunches such that each electron bunch of the second subset traverses a second gap of the second undulator, thereby generating a respective optical output via free-electron lasing.

12. The method of claim 11, wherein the third trajectory is directed into a third undulator separate from the first and second undulators, the method further comprising, at the third undulator, receiving the fourth subset of electron bunches such that each electron bunch of the third subset traverses a third gap of the third undulator, thereby generating a respective optical output via free-electron lasing.

13. The method of claim 12, wherein:

the optical outputs generated at the second undulator have a first optical polarization; and the optical outputs generated at the third undulator have a second optical polarization substantially different from the first optical polarization.

14. The method of claim 13, further comprising:

during the first sub-interval, providing optical outputs generated at the second undulator to a photolithography tool;

receiving an instruction to alter an optical polarization characteristic of light provided to the photolithography tool;

selecting the second substantially-periodic pattern based on the instruction; and during the second sub-interval, providing optical outputs generated at the third undulator to the photolithography tool;

wherein generating the second plurality of spatially-separated electron bunches is performed in response to receiving the instruction.

15. The method of claim 13, wherein the first and second optical polarizations are substantially linear, wherein the first optical polarization is substantially orthogonal to the second optical polarization.

16. The method of claim 11, wherein the first subset defines the first substantially-periodic pattern.

17. The method of claim 11, further comprising not providing electron bunches to the second undulator during the second sub-interval.

18. The method of claim 11, wherein the third trajectory is directed along a bypass path, wherein, during the second sub-interval, the fourth subset of electron bunches do not generate any optical outputs via free-electron lasing.

19. The method of claim 11, further comprising:

at a second pulsed light source of a second photocathode system, throughout the time interval, generating a second pulse train comprising a second sequence of light pulses;

at the second photocathode system, during the first sub-interval, generating a third plurality of spatially-separated electron bunches; and during the first sub-interval, at the electron bunch splitter, receiving each electron bunch of the third plurality of spatially-separated electron bunches from the second photocathode system, wherein, based on the timing scheme, the electron bunch splitter directs at least one electron bunch of the third plurality into a third undulator.

20. The method of claim 19, wherein:

the third plurality of spatially-separated electron bunches defines a third bunch repetition rate;

during the first sub-interval, the electron bunch splitter directs a first subset of the electron bunches of the third plurality into the third undulator, the first subset defining a first subset repetition rate;

the fourth subset of electron bunches are directed into the third undulator; and the method further comprises:

at the second photocathode system, during the second sub-interval, generating a fourth plurality of spatially-separated electron bunches defining a fourth bunch repetition rate substantially equal to the third bunch repetition rate; and during the second sub-interval, at the electron bunch splitter, receiving each electron bunch of the fourth plurality of spatially-separated electron bunches from the second photocathode system, wherein, based on the timing scheme, the electron bunch splitter directs a second subset of the electron bunches of the fourth plurality into the third undulator, the second subset defining a second subset repetition rate less than the first subset repetition rate.

* * * * *